United States Patent [19]

Miller

[11] Patent Number: 4,525,850

[45] Date of Patent: Jun. 25, 1985

[54] FLUID LEVEL SENSOR EMPLOYING HOT WIRE PROBE AND DIGITAL SAMPLE AND HOLD CIRCUITRY

[75] Inventor: Kenneth L. Miller, Brownsboro, Ala.

[73] Assignee: Chrysler Corporation, Highland Park, Mich.

[21] Appl. No.: 418,343

[22] Filed: Sep. 15, 1982

[51] Int. Cl.³ .................. G01F 23/00; G01F 23/24
[52] U.S. Cl. .................................. 377/19; 73/295; 73/304 R
[58] Field of Search ............... 377/19; 73/295, 304 R

[56] References Cited

U.S. PATENT DOCUMENTS

| 4,163,391 | 8/1979 | Bezard et al. | 73/304 R |
| 4,215,413 | 7/1980 | Stark et al. | 377/19 |
| 4,425,795 | 1/1984 | Albrecht et al. | 73/304 R |

Primary Examiner—John S. Heyman
Attorney, Agent, or Firm—Mark P. Calcaterra

[57] ABSTRACT

A digital sample and hold circuit for memorizing the initial voltage across an electrical resistance probe which is partly immersed in the liquid in a tank.

3 Claims, 1 Drawing Figure

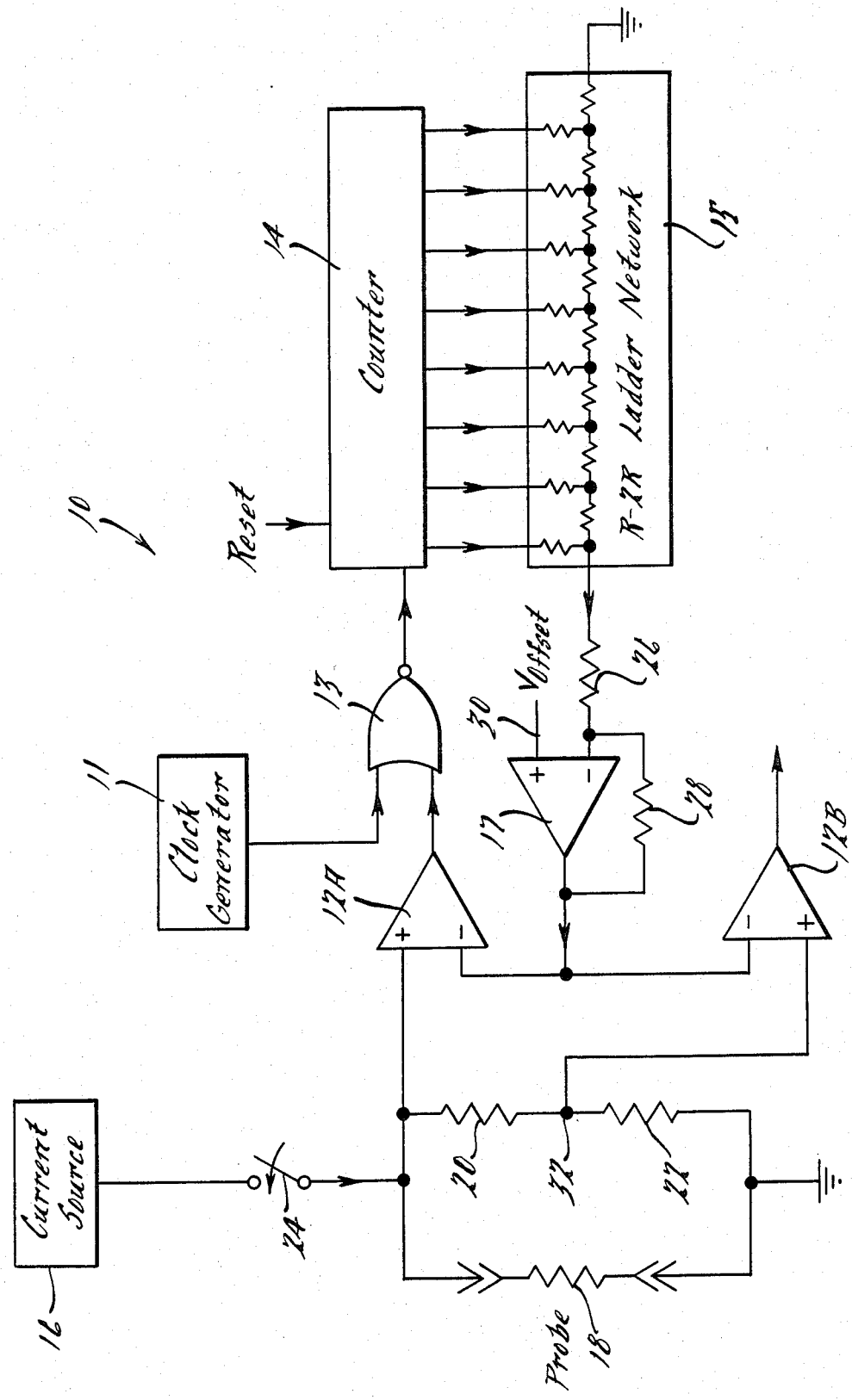

FLUID LEVEL SENSOR EMPLOYING HOT WIRE PROBE AND DIGITAL SAMPLE AND HOLD CIRCUITRY

BACKGROUND AND SUMMARY OF THE INVENTION

This invention relates generally to devices which check the level of a liquid in a tank by utilizing a partially submerged electrical resistance probe. More particularly this invention relates to a digital sample and hold circuit which memorizes the initial voltage across the electrical resistance probe.

Electrical resistance or hot-wire fluid level detection systems depend on the detection of probe resistance increase resulting from the application of a test current. The hot wire is mounted in a probe which in turn is positioned in the fluid to be monitored. The positive temperature coefficient characteristic of the hot wire produces a probe resistance increase when the test current is applied. The magnitude of this increase is proportional to the percentage of the hot wire element which is not immersed in fluid.

The sequence of electrical events which describe the complete fluid level sensing system are the application of current to the probe during the very short test interval, memorization of the initial voltage developed across the probe, measurement of the amplitude of the resistance change, comparison of the resistance change to a preselected threshold and the triggering of a warning signal when the fluid level is below the level corresponding to the preselected threshold.

In order to prevent the system from responding to resistance changes attrributable solely to the temperature of the probe environment, it is necessary to measure and memorize the initial resistance of the probe at the moment current is initially applied and to compare that initial resistance to the final resistance at the end of the test interval.

The warning threshold is selected to be between the energized probe's outputs representing the free air condition and the completely submersed condition.

Previous known designs have depended upon analog sample and hold circuits to memorize the initial probe resistance. Analog sample and hold circuits employ capacitors to retain a voltage proportional to the initial condition to be memorized. If the charge on the capacitor leaks off during the hold period, a memory error will occur. Conventional means to minimize the effects of this leakage effect are not cost effective.

Accordingly, it is an object of this invention to employ a digital sample and hold circuit to permit retention of any desired initial condition without the introduction of memory errors due to capacitor leakage.

Other objects and advantages of this invention will be made apparent as the description progresses.

DESCRIPTION OF THE DRAWINGS

In the accompanying drawing in which one of various possible embodiments is illustrated:

The FIGURE is an electrical block diagram of the complete fluid sensor system.

DESCRIPTION OF THE PREFERRED EMBODIMENT

The test interval is initiated at time t=0 by the application of a test current from a current source through switch means 24 energizing the probe 18 and the resistor path in parallel with the probe 18 formed by the series connection of 20 and 22.

The test current is applied for a total of approximately three seconds; it is during this time period that the sample and hold function occurs.

At time t=0, the output of the R-2R ladder network 15 is approximately equal to zero, the maximum output being approximately 5.0 volts. This zero level output of 15 is presented to the inverting input of operational amplifier 17 through an input resistor 26. The non-inverting input to operational amplifier 17 is presented with a fixed offset voltage 30 which is equal to approximately one-half of the peak output voltage of R-2R ladder network 15.

The result of these inputs to operational amplifier 17 at time t=0 is a high level output from 17 of approximately 4.5 volts. This high level voltage is presented to the inverting input of operational amplifier 12A.

The output of the probe 18 varies between 2.0 volts and 3.0 volts. Therefore, the non-inverting input to operational amplifier 12A is intially lower than the inverting input to 12A. The output of 12A is thus initially low and is presented to one input of NOR gate 13 while the output of clock generator 11 is presented to the other input of NOR gate 13.

The signal from clock 11 is therefore initially present on the output of NOR gate 13 and is presented to the input of counter 14 which is initially in the reset condition. The outputs of counter 14 are connected in the proper order to the inputs of R-2R ladder network 15. The output of R-2R ladder network 15 therefore increases with each count causing the output of operational amplifier 17 to decrease at a rate of approximately 20 millivolts per count. This is a typical system which utilizes an eight bit counter and a 5.0 volt counter supply voltage. The resolution is a function of the number of bits designed into the system.

When the output of operational amplifier 17, which is connected to the inverting input of operational amplifier 12A, drops below the non-inverting input of 12A, the output of 12A changes to a logical high voltage level. Since the output of 12A is connected to NOR gate 13, the output of NOR gate 13 is forced to a low level and pulses from clock 11 to counter 14 are interrupted The output of operational amplifier 17 therefore holds at a level very close to the initial value of probe voltage and will remain held at this level for any increasing probe voltage, thus eliminating memory errors due to capacitor leakage associated with analog sample and hold circuits.

The threshold alarm point voltage is determined by a resistive divider network 20 and 22 across probe 18. The division point 32 of this divider is connected to the non-inverting input of operational amplifier 12B while the inverting input of operational amplifier 12B is connected to the memorized voltage at the output of the operational amplifier 17. It should be appreciated that alternative means can be used to achieve the threshold point. Voltage outputs across probe 18 which exceed this threshold alarm point voltage will cause the output of operational amplifier 12B to change to a high voltage level and provide a trigger for a suitable warning device.

An alternative embodiment of the sample and hold circuit described herein provides for a fluid level detector which tracks decreasing voltages by omitting operational amplifier 17, connecting the output of R-2R ladder network 15 to the non-inverting inputs of 12A and 12B and feeding the probe voltage into the inverting input to 12A and the voltage at division point 32 into the inverting input to 12B.

In view of the foregoing it will be seen that the several objects and other advantages are attained.

Although several embodiments of the invention have been disclosed and described, it is apparent that other embodiments and modifications of the invention are possible.

What is claimed is:

1. In a fluid level sensing system which employs an electrical resistance, current excited probe, an electronic control circuit to measure the output of said probe, to memorize its initial value and to provide a warning signal when a preselected threshold is exceeded comprising:

a clock generator fed into a two input NOR gate; a resettable binary counter which counts clock pulses generated by said clock generator when presented with said pulses by said NOR gate; an R-2R resistor ladder network which receives the ouput from said binary counter and in response to the increased count from said counter incrementally and proportionally increases its voltage output; an inverting operational amplifier which when presented at its inverting input with said increasing voltage output from said R-2R resistor ladder network will generate an output which is a function of an input resistor and feedback resistor connected to said inverting input and an offset voltage which is presented to the non-inverting input to said inverting operational amplifier; an operational amplifier to compare said output of said inverting operational amplifier with the voltage across said electrical resistance probe and present an output based on said comparison to said two input NOR gate to control the transfer of said clock pulses to said resettable binary counter; a voltage divider means across said probe; an operational amplifier to compare said output of said inverting operational amplifier with a preselected threshold voltage which is generated at the division point of said voltage divider means and which generates a trigger pulse when said threshold voltage is exceeded.

2. A fluid sensing system as described in claim 1 wherein said R-2R resistor ladder network is directly connected to the non-inverting inputs of said comparison operational amplifiers and the probe voltage is presented to the inverting input to said comparison operational amplifier that feeds said NOR gates and said preselected threshold voltage is presented to the inverting input of said comparison operational amplifier that generates said alarm trigger pulse thereby replacing said inverting operational amplifier whereby the resulting electronic control circuit tracks decreasing voltages.

3. A fluid level sensing system as described in claim 1 wherein said voltage divider means comprises two resistors connected in series.

* * * * *